(12) United States Patent
Jung et al.

(10) Patent No.: US 11,600,776 B2
(45) Date of Patent: Mar. 7, 2023

(54) APPARATUS FOR AND METHOD OF FABRICATING SEMICONDUCTOR DEVICE

(71) Applicant: Samsung Electronics Co., Ltd., Suwon-si (KR)

(72) Inventors: Jaeho Jung, Seoul (KR); Kyoung Sun Kim, Suwon-si (KR); Jeonghee Park, Hwaseong-si (KR); Jiho Park, Suwon-si (KR); Changyup Park, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 412 days.

(21) Appl. No.: 17/033,460

(22) Filed: Sep. 25, 2020

(65) Prior Publication Data
US 2021/0013410 A1    Jan. 14, 2021

Related U.S. Application Data

(63) Continuation of application No. 16/149,507, filed on Oct. 2, 2018, now Pat. No. 10,818,839.

(30) Foreign Application Priority Data

Mar. 15, 2018  (KR) .................. 10-2018-0030387
Mar. 30, 2018  (KR) .................. 10-2018-0037419

(51) Int. Cl.
*H01L 45/00*     (2006.01)
*H01J 37/32*     (2006.01)
(Continued)

(52) U.S. Cl.
CPC .... *H01L 45/1625* (2013.01); *H01J 37/32522* (2013.01); *H01J 37/32724* (2013.01);
(Continued)

(58) Field of Classification Search
None
See application file for complete search history.

(56) References Cited

U.S. PATENT DOCUMENTS 7,015,422 B2   3/2006  Timans
7,029,505 B2   4/2006  Sha et al.
(Continued)

FOREIGN PATENT DOCUMENTS

JP    2003507881 A    2/2003
JP    2005044881 A    2/2005
(Continued)

*Primary Examiner* — Nicholas J Tobergte
*Assistant Examiner* — Kevin Quinto
(74) *Attorney, Agent, or Firm* — Muir Patent Law, PLLC

(57) ABSTRACT

An apparatus of fabricating a semiconductor device may include a chamber including a housing and a slit valve used to open or close a portion of the housing, a heater chuck provided in a lower region of the housing and used to heat a substrate, a target provided over the heater chuck, a plasma electrode provided in an upper region of the housing and used to generate plasma on the target, a heat-dissipation shield surrounding the inner wall of the housing between the plasma electrode and the heater chuck, and an edge heating structure provided between the heat-dissipation shield and the inner wall of the housing and configured to heat the heat-dissipation shield and an edge region of the substrate and to reduce a difference in temperature between center and edge regions of the substrate.

20 Claims, 15 Drawing Sheets

(51) Int. Cl.
*H01J 37/34* (2006.01)
*H01L 27/24* (2006.01)

(52) U.S. Cl.
CPC .... *H01J 37/32733* (2013.01); *H01J 37/3414* (2013.01); *H01J 37/3447* (2013.01); *H01J 2237/20214* (2013.01); *H01J 2237/332* (2013.01); *H01L 27/2409* (2013.01); *H01L 45/06* (2013.01); *H01L 45/1233* (2013.01)

(56) References Cited

U.S. PATENT DOCUMENTS

| | | | |
|---|---|---|---|
| 7,358,462 B2 * | 4/2008 | Timans | H01L 21/67248 118/724 |
| 7,893,420 B2 | 2/2011 | Liang et al. | |
| 8,580,606 B2 | 11/2013 | Park et al. | |
| 8,926,806 B2 | 1/2015 | Tsai et al. | |
| 9,336,879 B2 | 5/2016 | Lung et al. | |
| 2003/0116426 A1 | 6/2003 | Kim et al. | |
| 2004/0234696 A1 | 11/2004 | Hongo et al. | |
| 2006/0016396 A1 | 1/2006 | Kuh et al. | |
| 2006/0096851 A1 | 5/2006 | Lavitsky et al. | |
| 2006/0249724 A1 | 11/2006 | Krusin-Elbaum et al. | |
| 2007/0297775 A1 | 12/2007 | Koren et al. | |
| 2008/0116067 A1 | 5/2008 | Lavitsky et al. | |
| 2011/0244663 A1 | 10/2011 | Su | |
| 2013/0277203 A1 | 10/2013 | Rasheed et al. | |
| 2015/0079301 A1 | 3/2015 | Nemani et al. | |
| 2016/0102396 A1 | 4/2016 | Wu et al. | |

FOREIGN PATENT DOCUMENTS

| | | |
|---|---|---|
| JP | 5705689 B2 | 4/2015 |
| JP | 6238963 B2 | 11/2017 |
| KR | 10-2002-0089592 | 11/2002 |
| KR | 1020050043755 A | 5/2005 |
| KR | 20070085311 A | 8/2007 |
| KR | 10-1000219 B1 | 12/2010 |
| KR | 10-1429963 B1 | 8/2014 |
| KR | 10-1644062 B1 | 7/2016 |
| WO | 0113054 A1 | 2/2001 |

* cited by examiner

APPARATUS FOR AND METHOD OF FABRICATING SEMICONDUCTOR DEVICE

CROSS-REFERENCE TO RELATED APPLICATIONS

This U.S. non-provisional patent application is a continuation of U.S. patent application Ser. No. 16/149,507, filed Oct. 2, 2018, in the U.S. Patent and Trademark Office, which claims the benefit of priority under 35 U.S.C. § 119 to Korean Patent Application No. 10-2018-0030387, filed Mar. 15, 2018, and Korean Patent Application No. 10-2018-0037419, filed Mar. 30, 2018, in the Korean Intellectual Property Office, the entire contents of all of which are hereby incorporated by reference.

BACKGROUND OF THE INVENTION

The present disclosure relates to an apparatus, which is used to fabricate a semiconductor device, and a method of fabricating a semiconductor device using the apparatus, and in particular, to an apparatus, which is used to deposit a phase transition layer, and a method of fabricating a semiconductor device using the same.

In general, a semiconductor device is fabricated by a plurality of unit processes. The unit processes include a deposition process, a lithography process, and an etching process. The deposition process and the etching process may be performed using plasma. The plasma is used to treat a substrate at a high temperature.

SUMMARY

Some example embodiments provide an apparatus, which is configured to deposit a thin film with improved thickness uniformity, and a method of fabricating a semiconductor device using the same.

According to some embodiments, the disclosure is directed to an apparatus for fabricating a semiconductor device, comprising: a chamber including a housing and a slit valve, wherein the slit valve is configured to open or close a portion of the housing; a heater chuck provided in a lower region of the housing and configured to heat a substrate; a heat-dissipation shield provided along an inner wall of the housing and outside the heater chuck; and an edge heating structure provided between the heat-dissipation shield and the inner wall of the housing and configured to heat the heat-dissipation shield and an edge region of the substrate and to reduce a difference in temperature between center and edge regions of the substrate.

According to some embodiments, the disclosure is directed to an apparatus for fabricating a semiconductor device, comprising: a chamber including a housing and a slit valve, wherein the slit valve is configured to open or close a portion of the housing; a heater chuck provided in a lower region of the housing and configured to heat a substrate; a target provided over the heater chuck, the target containing a source material of a thin film to be formed on the substrate; a plasma electrode provided in an upper region of the housing and configured to generate plasma on the target; a heat-dissipation shield surrounding an inner wall of the housing between the plasma electrode and the heater chuck; and an edge heating structure provided between the heat-dissipation shield and the inner wall of the housing and configured to heat the heat-dissipation shield and an edge region of the substrate and to reduce a difference in temperature between center and edge regions of the substrate.

According to some embodiments, the disclosure is directed to a method of fabricating a semiconductor device, comprising: forming a lower electrode on a substrate; forming a mold layer having a contact hole exposing the lower electrode; and forming a phase transition layer in the contact hole, wherein the forming of the phase transition layer comprises depositing a preliminary phase transition layer in the contact hole by a physical vapor deposition method using a heater chuck and an edge heating structure, wherein the heater chuck heats a bottom surface of the substrate, and wherein the edge heating structure is provided outside the heater chuck and is used to heat an edge region of the substrate and to reduce a difference in temperature between center and the edge region of the substrate.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments will now be described more fully with reference to the accompanying drawings, in which example embodiments are shown.

Figure 1:
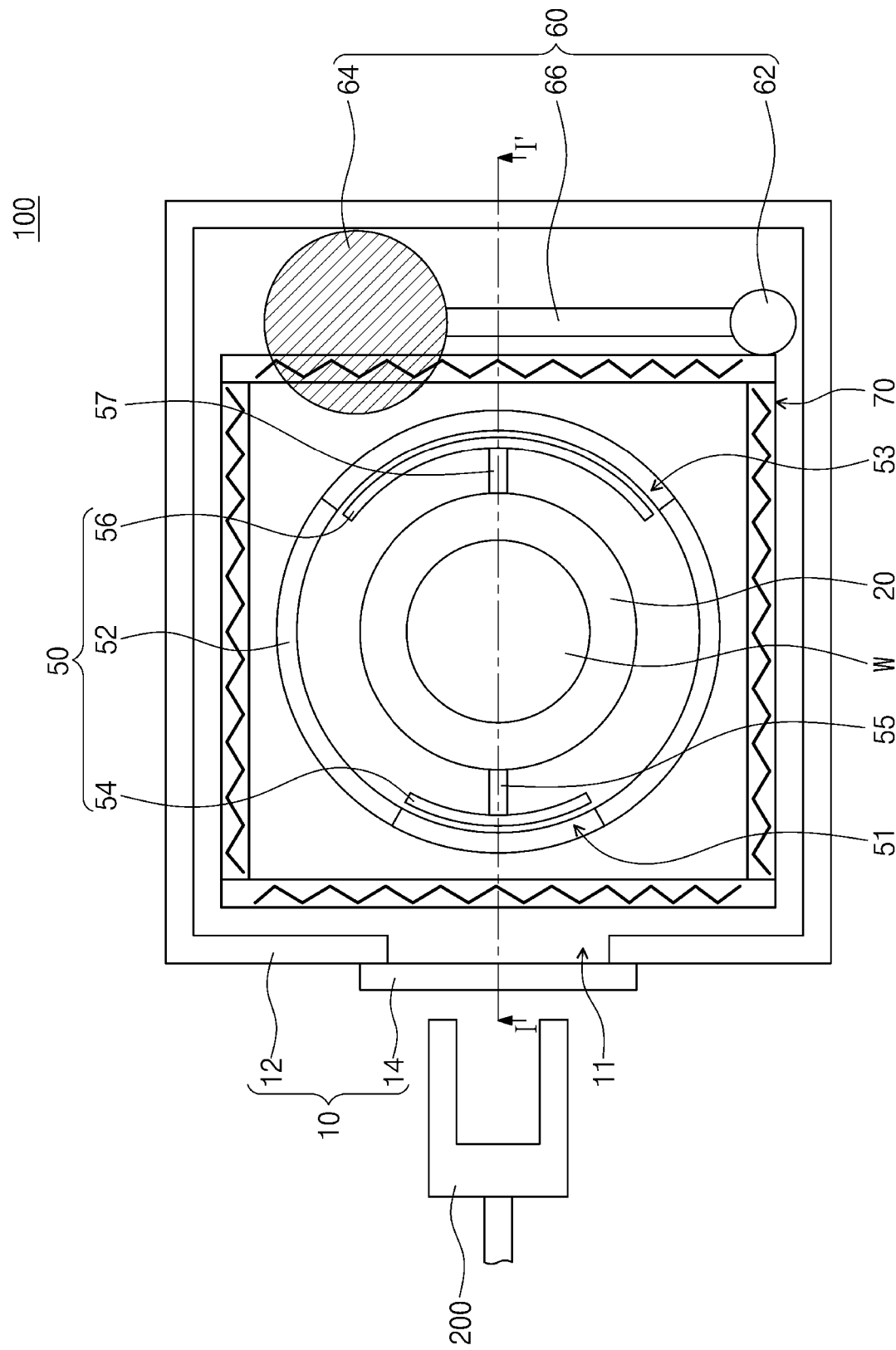
FIG. 1 is a plan view illustrating an apparatus of fabricating a semiconductor device, according to an example embodiment.
Figure 2:
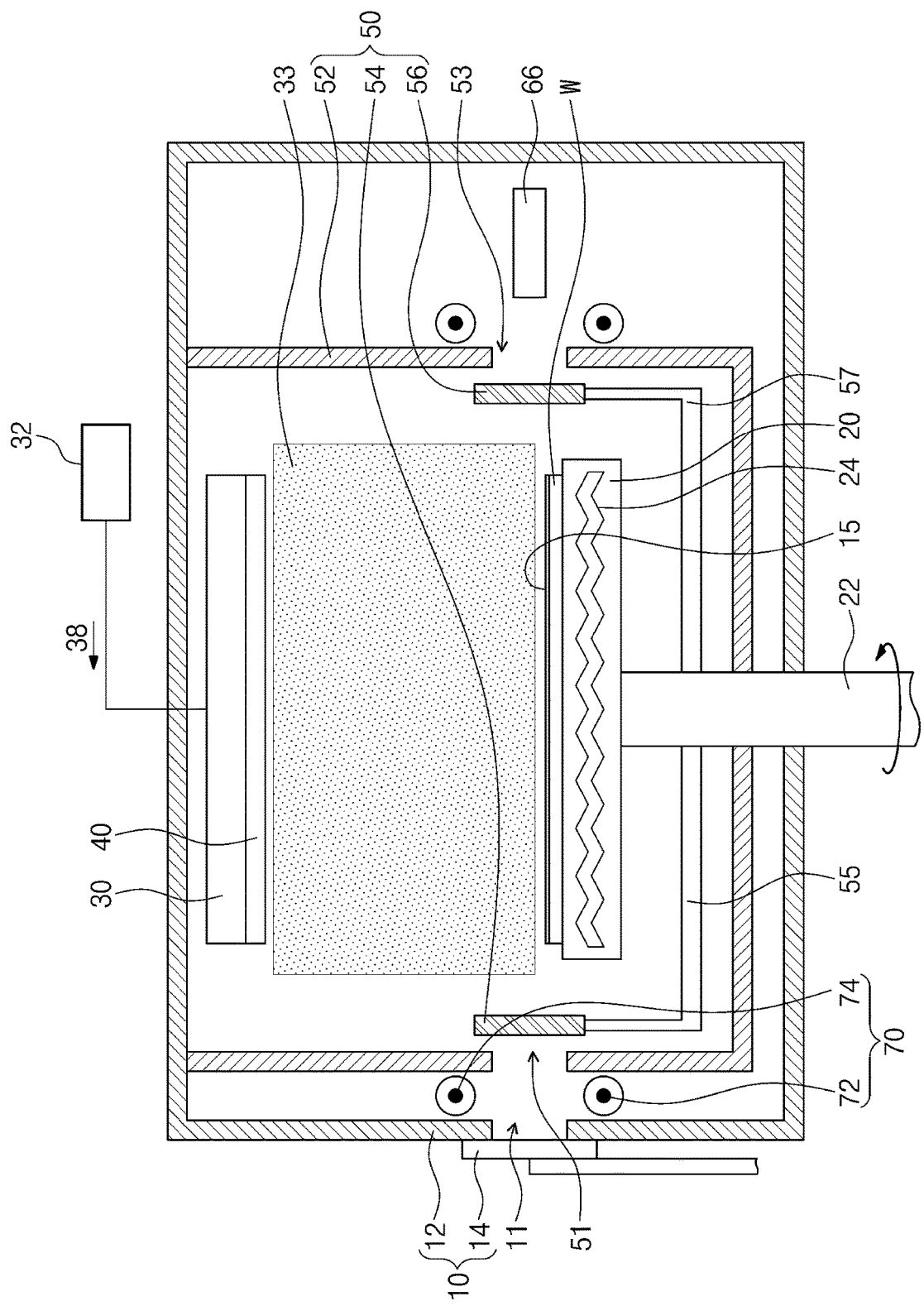
FIG. 2 is a sectional view taken along line I-I' of FIG. 1.

FIG. 1 is a plan view illustrating a fabrication apparatus 100, which is used to fabricate a semiconductor device, according to an example embodiment. FIG. 2 is a sectional view taken along line I-I' of FIG. 1.

Referring to FIGS. 1 and 2, the fabrication apparatus 100 may include a physical vapor deposition (PVD) system such as a sputter system. In some embodiments, the fabrication apparatus 100 may include a chamber 10, a heater chuck 20, a plasma electrode 30, a target 40, a heat-dissipation shield 50, a shutter structure 60, and an edge heating structure 70.

The chamber 10 may be configured to provide an isolated space for a substrate W. The chamber 10 may be configured to have a pressure of, for example, about 1.0E-8 Torr to about 1.0E-4 Torr. In some embodiments, the chamber 10 may include a housing 12 and a slit valve 14. The housing 12 may be provided to enclose the heater chuck 20, the plasma electrode 30, the target 40, the heat-dissipation shield 50, the shutter structure 60, and the edge heating structure 70. The housing 12 may include a door hole 11, which is configured to allow for loading or unloading of the substrate W into or out of the chamber 10. The slit valve 14 may be used to open or close the door hole 11. For example, when the substrate W is loaded into the chamber 10 using a robot arm 200, the slit valve 14 may open the door hole 11, and when a fabrication process is performed on the substrate W, the slit valve 14 may close the door hole 11.

The heater chuck 20 may be provided in a lower region of an internal space of the housing 12. For example, the heater chuck 20 may be placed on a shaft 22, which is provided to penetrate into a lower portion of the housing 12. The shaft 22 may be configured to rotate the heater chuck 20. The heater chuck 20 may be configured to load the substrate W. For example, when the substrate W is loaded onto the heater chuck 20, the shaft 22 may cause the heater chuck 20 and substrate W to rotate at a pre-determined speed. The heater chuck 20 may include a heater line 24. In the case where heating power is supplied to the heater line 24, the heater line 24 may be used to heat the substrate W. For example, the substrate W may be heated up to about 300° C. or higher by the heater line 24.

The plasma electrode 30 may be placed at an upper region of the internal space of the housing 12. The plasma electrode 30 may be connected to a radio frequency (RF) power supplier 32, which is configured to supply an RF power 38. The RF power 38 supplied to the plasma electrode 30 may be used to generate plasma 33 in the housing 12.

The target 40 may be located between the plasma electrode 30 and the substrate W. The target 40 may be fixed on a bottom surface of the plasma electrode 30. The target 40 may contain a source material, which is used to deposit a thin film 15 (e.g., a preliminary phase transition layer 116a of FIG. 12) on the substrate W loaded on the heater chuck 20. In some embodiments, the target 40 may contain at least one of chalcogenide compounds (e.g., including Ge (Germanium), Sb (Antimony), or Te (Tellurium)). In the case where the plasma 33 is generated between the target 40 and the substrate W, source particles (not shown) may be produced from the target 40. The source particles may be deposited on the substrate W to form the thin film 15. An amount of the source particles or a thickness of the thin film 15 may be increased in proportion to the amount of the plasma or an intensity of the RF power.

The heat-dissipation shield 50 may be disposed on an inner wall of the housing 12 between the heater chuck 20 and the plasma electrode 30. The heat-dissipation shield 50 may define a region, in which the plasma 33 on the substrate W is generated. In certain embodiments, the heat-dissipation shield 50 may be configured to reduce a spatial variation in temperature of the substrate W or a spatial difference in temperature between center and edge regions of the substrate W. For example, the heat-dissipation shield 50 may improve temperature uniformity across the center and edge regions of the substrate W. In some embodiments, the heat-dissipation shield 50 may include a tube shield 52, a first sector shield 54, and a second sector shield 56.

The tube shield 52 may be provided to surround the inner wall of the housing 12 located between the heater chuck 20 and the plasma electrode 30. In addition, the tube shield 52 may be configured to have first and second openings 51 and 53. The first shield opening 51 may be located adjacent to the door hole 11 of the housing 12. The second shield opening 53 may be located adjacent to the shutter structure 60. The second shield opening 53 may be located to face the first shield opening 51. For example, the second shield opening 53 may be opposite the first shield opening 51 across the substrate W. The first and second openings 51 and 53 may serve as heat-dissipation or heat-sink regions, through which heat energy from an edge region of the substrate W is exhausted.

The first sector shield 54 may be provided adjacent to the first shield opening 51. A first branch arm 55 may connect the first sector shield 54 to the shaft 22. In some embodiments, the first branch arm 55 may diverge from the shaft 22, extending from the shaft 22 at a perpendicular angle. In the case where the shaft 22 is rotated, the first shield opening 51 may be opened or closed by the first sector shield 54, using the first branch arm 55. If the first shield opening 51 is closed by the first sector shield 54, the first sector shield 54 may prevent heat energy from being exhausted from the edge region of the substrate W, thereby allowing the substrate W to be uniformly heated.

The second sector shield 56 may be provided adjacent to the second shield opening 53. A second branch arm 57 may connect the second sector shield 56 to the shaft 22. In some embodiments, the second branch arm 57 may diverge from the shaft 22, extending from the shaft 22 at a perpendicular angle. The second branch arm 57 may be located opposite to the first branch arm 55 with respect to the shaft 22. In the case where the shaft 22 is rotated, the second shield opening 53 may be opened or closed by the second sector shield 56, using the second branch arm 57. If the second shield opening 53 is closed by the second sector shield 56, the second sector shield 56 may prevent heat energy from being exhausted from the edge region of the substrate W, thereby allowing the substrate W to be uniformly heated.

The shutter structure 60 may be placed outside the tube shield 52. In certain cases, the shutter structure 60 may be provided on the substrate W. For example, when the plasma 33 is not generated in the housing 12, the shutter structure 60 may be provided to cover the substrate W. In addition, before or after the formation of the thin film 15, the shutter structure 60 may be provided on the substrate W to protect the substrate W from the plasma 33. In some embodiments, the shutter structure 60 may include a shutter driver 62, a shutter plate 64, and a shutter arm 66. The shutter driver 62 may be provided adjacent to a wall of the housing 12. The shutter arm 66 may be provided to connect the shutter plate 64 to the shutter driver 62. The shutter driver 62 may be configured to rotate the shutter arm 66. The rotation of the shutter arm 66 may be controlled to dispose the shutter plate 64 either on the substrate W or outside the tube shield 52.

Figure 3:
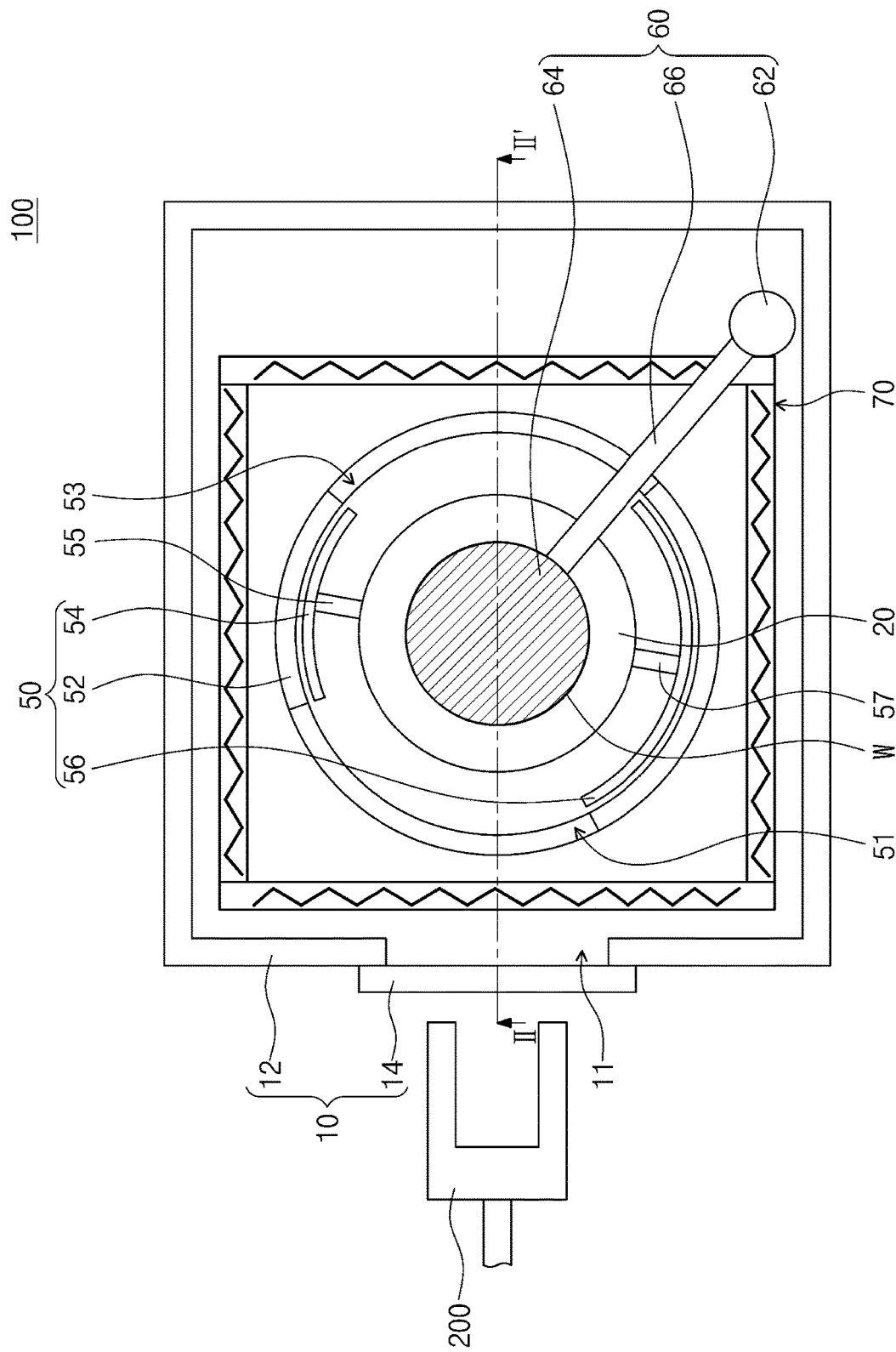
FIG. 3 is a plan view illustrating a shutter plate provided on a substrate of FIG. 1.
Figure 4:
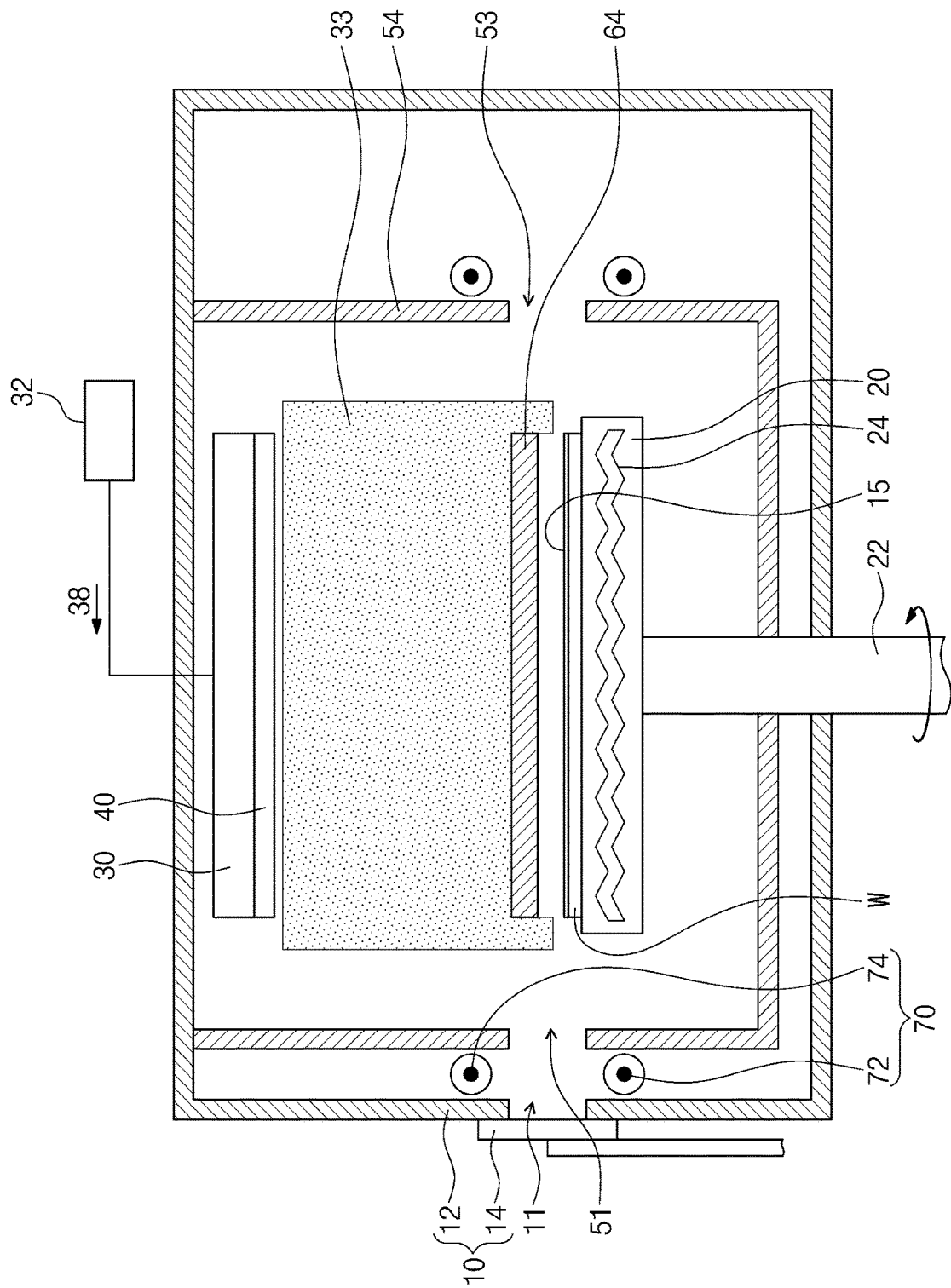
FIG. 4 is a sectional view taken along line II-II' of FIG. 3.

FIG. 3 is a plan view illustrating the shutter plate 64 provided on the substrate W of FIG. 1. FIG. 4 is a sectional view taken along line II-II' of FIG. 3.

Referring to FIGS. 3 and 4, if the second shield opening 53 is opened by rotation of the second sector shield 56, the shutter plate 64 may be disposed onto the substrate W. The shutter plate 64 may be used to prevent the substrate W from being exposed to the plasma 33, and in this case, the thin film 15 may be prevented from being deposited on the substrate W. In addition, the shutter plate 64 may be used to cover the substrate W, before the generation of the plasma 33. If the shutter plate 64 is moved outside the tube shield, the second shield opening 53 may be closed by the second sector shield 56.

Referring to FIGS. 1 to 4, the edge heating structure 70 may be placed between a side wall of the housing 12 and the tube shield 52. The edge heating structure 70 may be provided to surround the tube shield 52 provided along the edge region of the substrate W. The edge heating structure 70 may be configured to heat the tube shield 52 or to increase temperature of the edge region of the substrate W. For example, the edge heating structure 70 may include a halogen lamp. In some embodiments, the edge heating structure 70 may include lower lamps 72 and upper lamps 74.

The lower lamps 72 may be placed outside the tube shield 52 adjacent to the heater chuck 20. For example, the lower lamps 72 may be located at a same level as the heater chuck 20, and surrounding an outside edge region of the heater chuck 20. In some embodiments, the lower lamps 72 may be provided at a lower level than that of the slit valve 14. For example, a bottom edge of the slit valve 14 may be located at a higher level than the lower lamps 72. The lower lamps 72 may be provided to surround a lower portion of the tube shield 52, which is located below the first and second openings 51 and 53. For example, the lower lamps 72 may be at a lower level than that of the first and second openings 51 and 53. The lower lamps 72 may be used to heat the lower portion of the tube shield 52 located below the first and second openings 51 and 53, and in this case, the edge region of the substrate W may be heated by a radiant heat emitted from the lower portion of the tube shield 52.

The upper lamps 74 may be provided to surround an upper portion of the tube shield 52, which is located above the first and second openings 51 and 53. For example, the upper lamps 74 may be at a higher level than that of the first and second openings 51 and 53. In some embodiments, the upper lamps 74 may be provided at a higher level than that of the slit valve 14. For example, a top edge of the slit valve 14 may be located at a lower level than the upper lamps 74. The upper lamps 74 may be aligned with the lower lamps 72 in a vertical direction. The upper lamps 74 may be used to heat the upper portion of the tube shield 52 located above the first and second openings 51 and 53, and in this case, the edge region of the substrate W may be heated by a radiant heat emitted from the upper portion of the tube shield 52.

Figure 5:
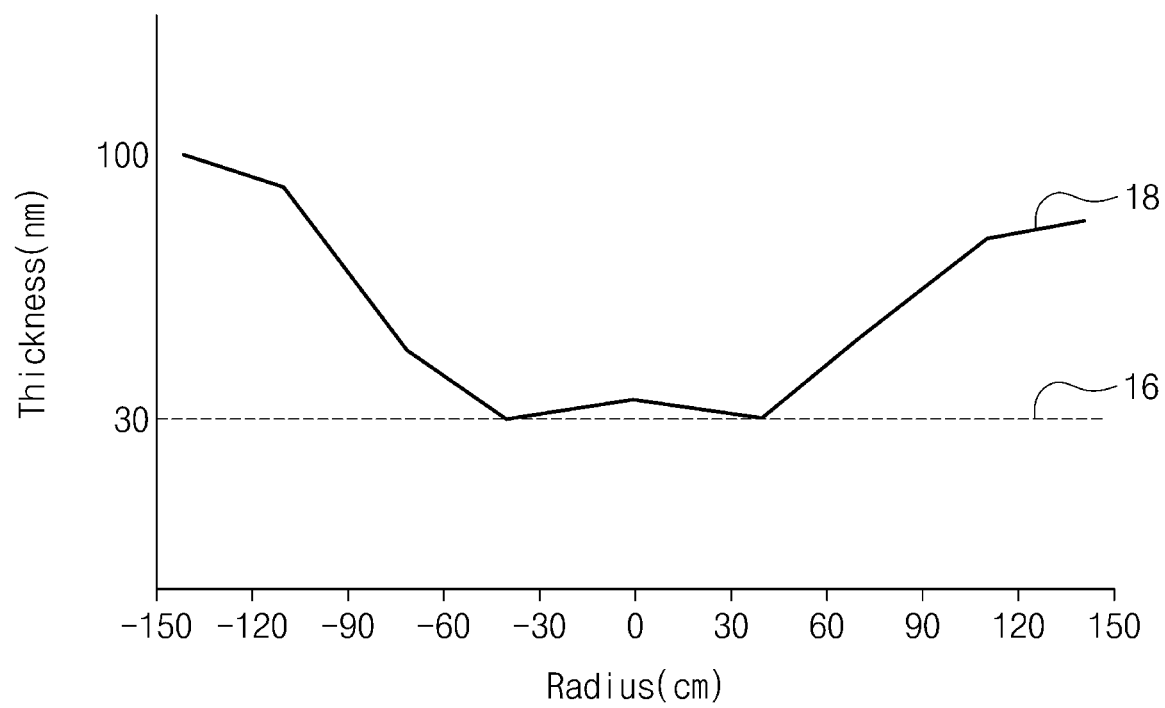
FIG. 5 is a graph showing thickness profiles of layers that were formed by an apparatus according to an example embodiment and by a conventional apparatus.

In FIG. 5, the curve 16 shows a thickness profile of a thin film, which was formed using the lower and upper lamps 72 and 74 of FIG. 2, and the curve 18 shows a thickness profile of a thin film, which was formed by a conventional method. The horizontal axis represents a radial distance from a center of a substrate W, and the vertical axis represents a thickness of a thin film formed on the substrate. The substrate W had a radius of 150 mm.

Referring to FIG. 5, the curve 16 was more uniform than the curve 18. That is, as shown in the curve 16, when the system of FIG. 2 was used, a thin film was uniformly formed throughout the substrate W. In other words, there was no substantial difference in thickness between a center region (e.g., 0 to ±60 cm radius) of the substrate W and an edge region (e.g., ±60 cm to ±150 cm radius). By contrast, as shown in the curve 18, when the conventional system was used, a thin film was thicker, by about 100 nm, on an edge region (e.g., ±60 cm to ±150 cm radius) of the substrate W than on the center region (e.g., 0 to ±60 cm radius) of the substrate W. When the conventional system was used, the thickness of the thin film was greater on the edge region of the substrate W than on the center region of the substrate W. Thickness uniformity of the thin film according to some example embodiments was better than that of the thin film according to the conventional method. This result shows that if the lower and upper lamps 72 and 74 are used to heat the edge region of the substrate W, it is possible to form a thin film with improved thickness uniformity.

The fabrication apparatus 100 may be used to fabricate a semiconductor device, as will be described below.

Figure 6:
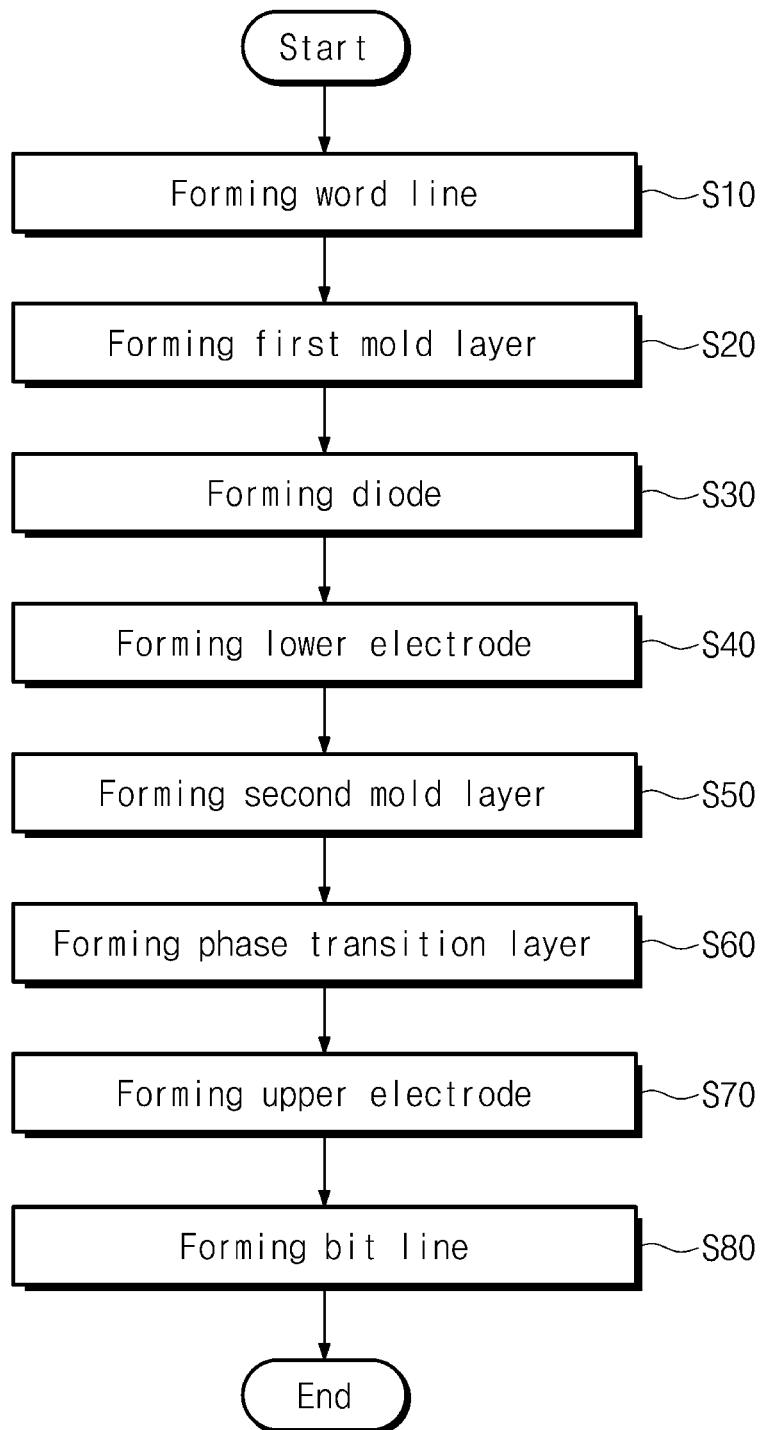
FIG. 6 is a flow chart illustrating a method of fabricating a semiconductor device, according to an example embodiment.

FIG. 6 is a flow chart illustrating a method of fabricating a semiconductor device, according to an example embodiment. FIGS. 7 to 15 are sectional views illustrating process steps which are sequentially performed according to the method of FIG. 6.

A method described herein may be used to fabricate a semiconductor device (e.g., a phase transition memory device), but the disclosure is not limited thereto. Referring to FIG. 6, the method may include forming a word line (in S10), forming a first mold layer (in S20), forming a diode (in S30), forming a lower electrode (in S40), forming a second mold layer (in S50), forming a phase transition layer (in S60), forming an upper electrode (in S70), and forming a bit line (in S80).

Figure 7:
FIGS. 7 to 15 are sectional views illustrating process steps which are sequentially performed according to the method of FIG. 6.

Referring to FIGS. 6 and 7, a word line 102 may be formed on the substrate W (in S10). The substrate W may be or may include a silicon wafer. The word line 102 may be formed of or may include at least one of conductive materials (e.g., doped silicon or metals). In some embodiments, the word line 102 may be formed through an ion implantation process of injecting dopants into the substrate W. In certain embodiments, the word line 102 may be formed by depositing a conductive layer using a deposition process (e.g., PVD or CVD) and then performing a photolithography and etching process on the conductive layer. In this case, the word line 102 may be formed on the substrate W to extend in a first direction (not shown).

Figure 8:
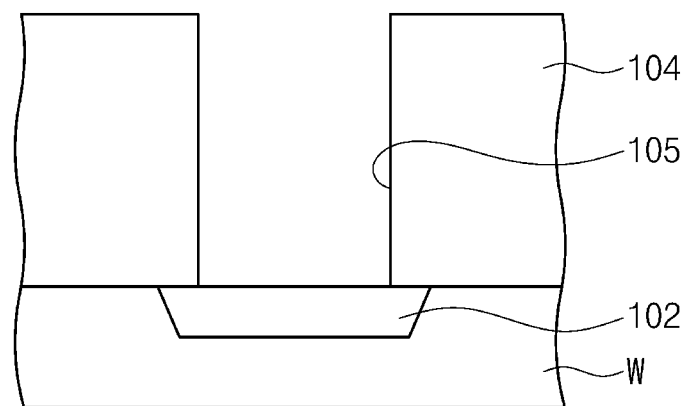

Referring to FIGS. 6 and 8, a first mold layer 104 may be formed on the substrate W to cover at least a portion of the word line 102 (in S20). The first mold layer 104 may be formed of or include at least one of dielectric materials (e.g., silicon oxide, silicon nitride, or silicon oxynitride). The first mold layer 104 may be formed by depositing a dielectric layer using a deposition process (e.g., CVD). The first mold layer 104 may be formed to have a first contact hole 105. The first contact hole 105 may be formed to expose a portion of the word line 102. For example, the first contact hole 105 may be formed to expose a portion of the top surface of the word line 102. The formation of the first contact hole 105 may include performing a photolithography process and then performing an etching process on the first mold layer 104.

Figure 9:
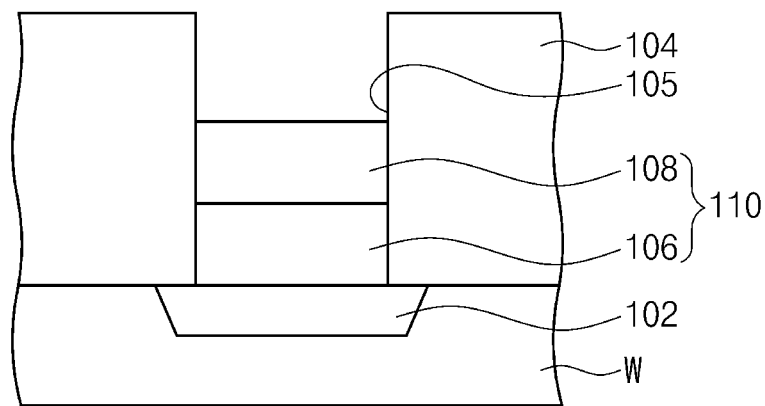

Referring to FIGS. 6 and 9, a diode 110 may be formed in the first contact hole 105 of the first mold layer 104 (in S30). The diode 110 may be formed within a lower region of the first contact hole 105. The formation of the diode 110 may include forming a poly silicon layer using a deposition process and performing an ion implantation process of injecting dopants (e.g., boron or arsenic) into the poly silicon layer. The diode 110 may be formed to include a first doped region 106 and a second doped region 108. The first doped region 106 may be formed in the first contact hole 105 and on the word line 102. A bottom surface of the first doped region 106 may be in contact with the top surface of the word line 102. The second doped region 108 may be formed on the first doped region 106. A bottom surface of the second doped region 108 may contact the top surface of the first doped region 106. Dopants in the first doped region 106 may be different from those in the second doped region 108. For example, in the case where the first doped region 106 is doped with boron, the second doped region 108 may be doped with arsenic.

Figure 10:
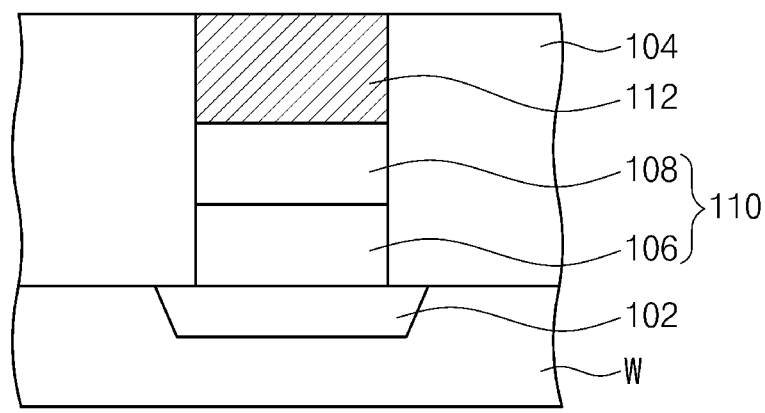

Referring to FIGS. 6 and 10, a lower electrode 112 may be formed on the diode 110 (in S40). The lower electrode 112 may be formed in an upper region of the first contact hole 105. In some embodiments, the lower electrode 112 may be formed by a damascene process. For example, the formation of the lower electrode 112 may include forming a metal or metal silicide layer using a deposition process and polishing the metal or metal silicide layer.

Figure 11:
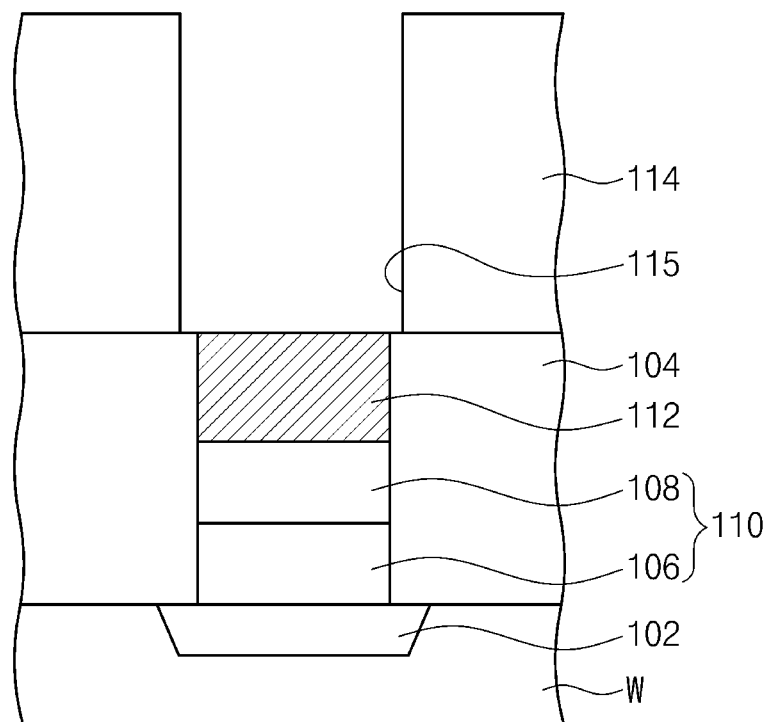

Referring to FIGS. 6 and 11, a second mold layer 114 may be formed on the lower electrode 112 and the first mold layer 104 (in S50). The second mold layer 114 may be formed of or may include at least one of dielectric materials (e.g., silicon oxide, silicon nitride, or silicon oxynitride). The second mold layer 114 may be formed by depositing a dielectric layer using a deposition process (e.g., CVD). The second mold layer 114 may be formed to have a second contact hole 115 exposing the lower electrode 112. In some embodiments, the second contact hole 105 may expose an entire top surface of the lower electrode 112 and part of a top surface of the first mold layer 104. The formation of the second contact hole 115 may include performing a photolithography process and then performing an etching process on the second mold layer 114.

Figure 12:
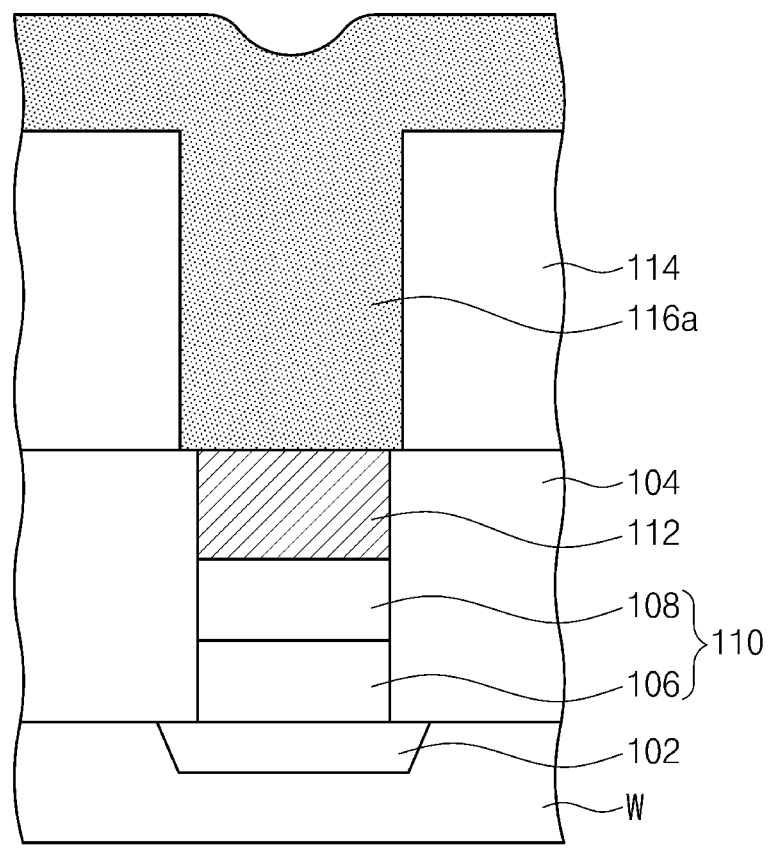
Figure 13:
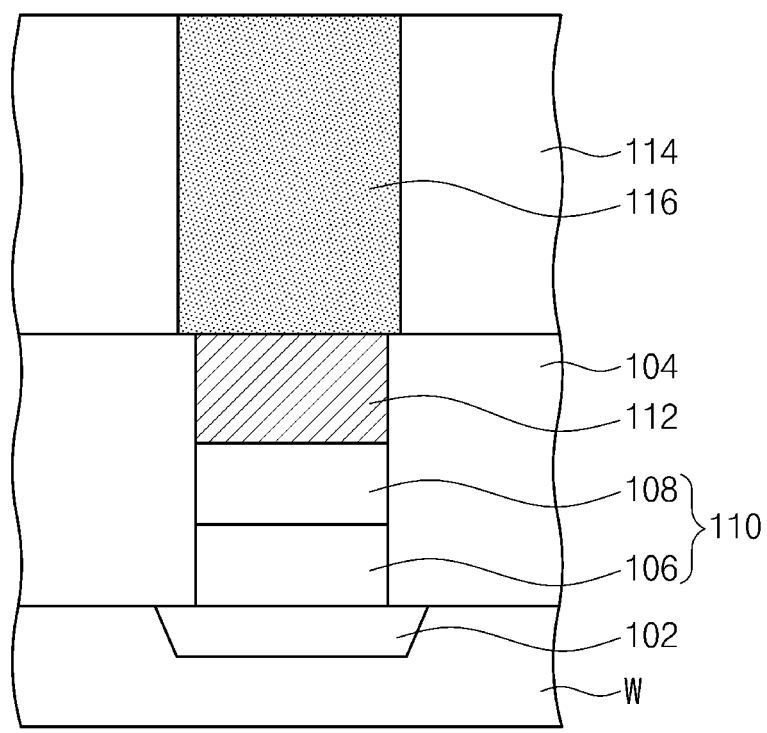

Referring to FIGS. 6, 12, and 13, a phase transition layer 116 may be formed in the second contact hole 115 and on the lower electrode 112 (in S60). The phase transition layer 116 may be formed to extend over a top surface of the second mold layer 114. In some embodiments, the phase transition layer 116 may be formed by a damascene process.

Figure 16:
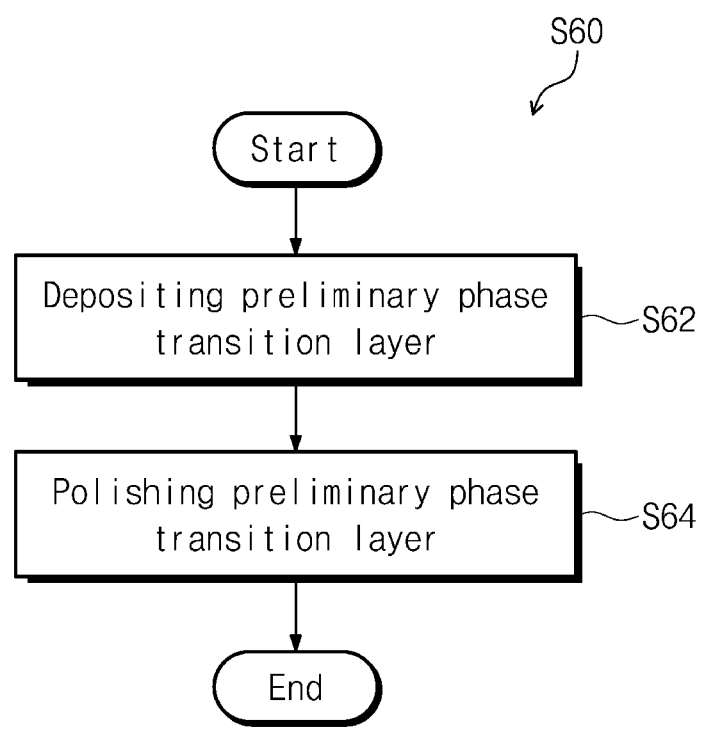
FIG. 16 is a flow chart illustrating a step of forming a phase transition layer of FIG. 6.

FIG. 16 illustrates an example flowchart of the step S60 of FIG. 6 (i.e., of forming the phase transition layer 116.

Referring to FIG. 16, the step S60 of forming the phase transition layer 116 may include depositing a preliminary phase transition layer 116a (in S62) and polishing the preliminary phase transition layer 116a to form the phase transition layer 116 (in S64).

Referring to FIGS. 12 and 16, a preliminary phase transition layer 116a may be deposited on the lower electrode 112 and the second mold layer 114 to fill the second contact hole 115 (in S56), and the fabrication apparatus 100 may be used to form the preliminary phase transition layer 116a. The preliminary phase transition layer 116a may be formed of or may include at least one of chalcogenide compounds (e.g., including Ge, Sb, or Te). In some embodiments, a physical vapor deposition method (e.g., a sputtering method), in which the heat-dissipation shield 50 and the edge heating structure 70 are used, may be performed to form the preliminary phase transition layer 116a to a uniform thickness. The edge heating structure 70 may be used to heat the heat-dissipation shield 50 adjacent to the substrate W, and in this case, an edge region of the substrate W may be heated by radiant heat emitted from the heat-dissipation shield 50. For example, the edge heating structure 70 may apply heat to the heat-dissipation shield 50, raising the temperature of the heat-dissipation shield 50.

Referring to FIGS. 13 and 16, the preliminary phase transition layer 116a may be polished to form a phase transition layer 116 in the second contact hole 115 (in S58).

A chemical mechanical polishing (CMP) method may be used to polish the preliminary phase transition layer 116a. The polishing of the preliminary phase transition layer 116a may be performed to expose the top surface of the second mold layer 114. The phase transition layer 116 may be formed in the second contact hole 115. For example, the phase transition layer 116, which was formed in the second contact hole 115 and on a top surface of the second mold layer 114, may be removed from above the second mold layer 114 so that it remains only in the second contact hole 115.

Figure 14:
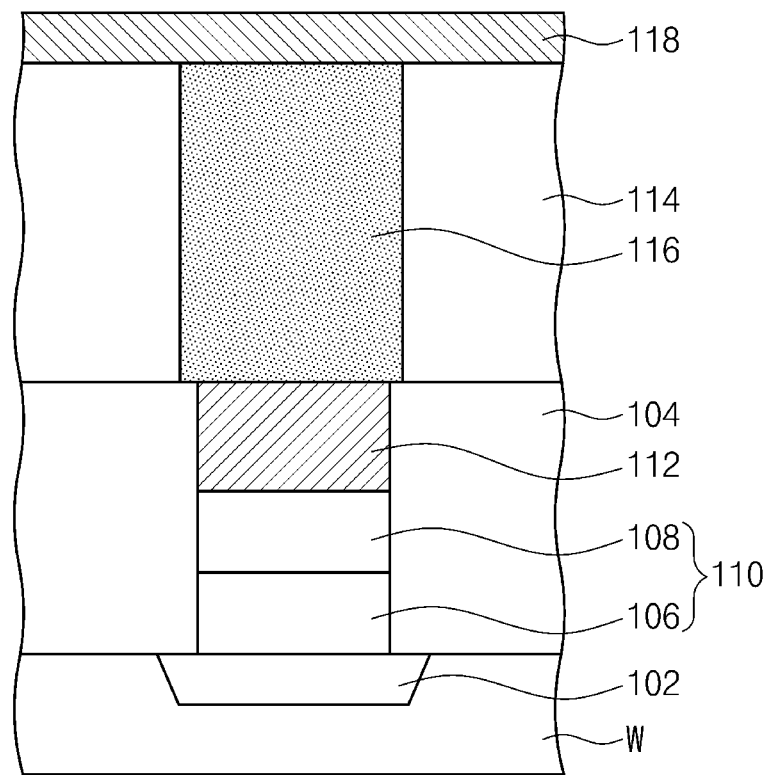

Referring to FIGS. 14 and 16, an upper electrode 118 may be formed on the phase transition layer 116 and the second mold layer 114 (in S60). The upper electrode 118 may be formed by depositing a metal layer using a deposition process (e.g., PVD or CVD) and then performing a photolithography and etching process on the metal layer. In some embodiments, the upper electrode 118 may have a substantially uniform thickness above a top surface of the phase transition layer 116 and a top surface of the second mold layer 114.

Figure 15:
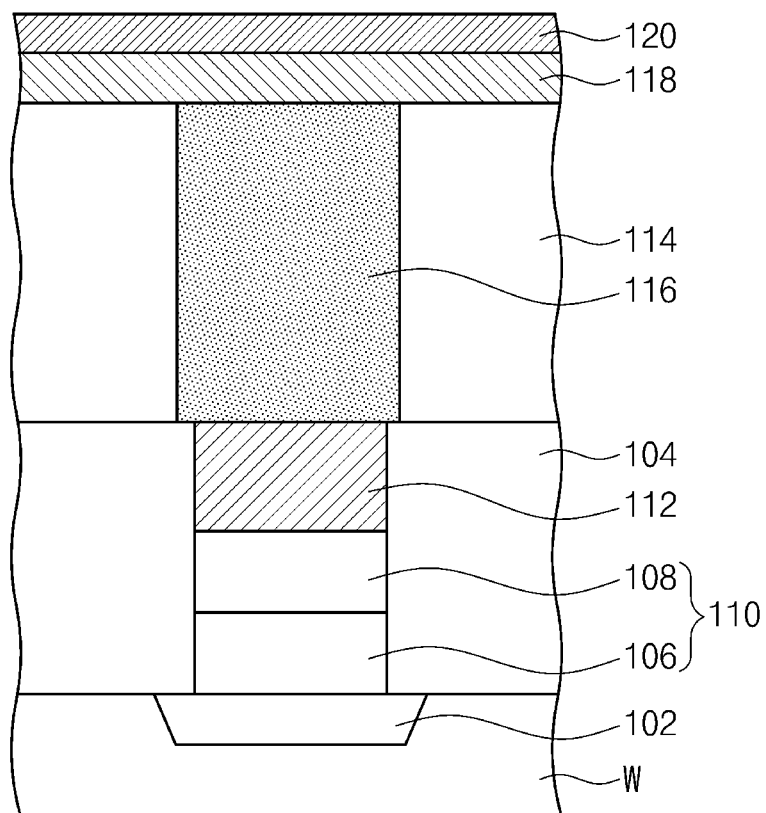

Referring to FIG. 15, a bit line 120 may be formed on the upper electrode 118 (in S70). In some embodiments, the bit line 120 may have a substantially uniform thickness above a top surface of the upper electrode 118. The bit line 120 may be formed by depositing a metal layer using a deposition process (e.g., PVD or CVD) and then performing a photolithography and etching process on the metal layer. The bit line 120 may extend in a second direction, which is different from an extension direction of the word line 102 or from the first direction. In some embodiments, the second direction is perpendicular to the first direction.

Figure 17:
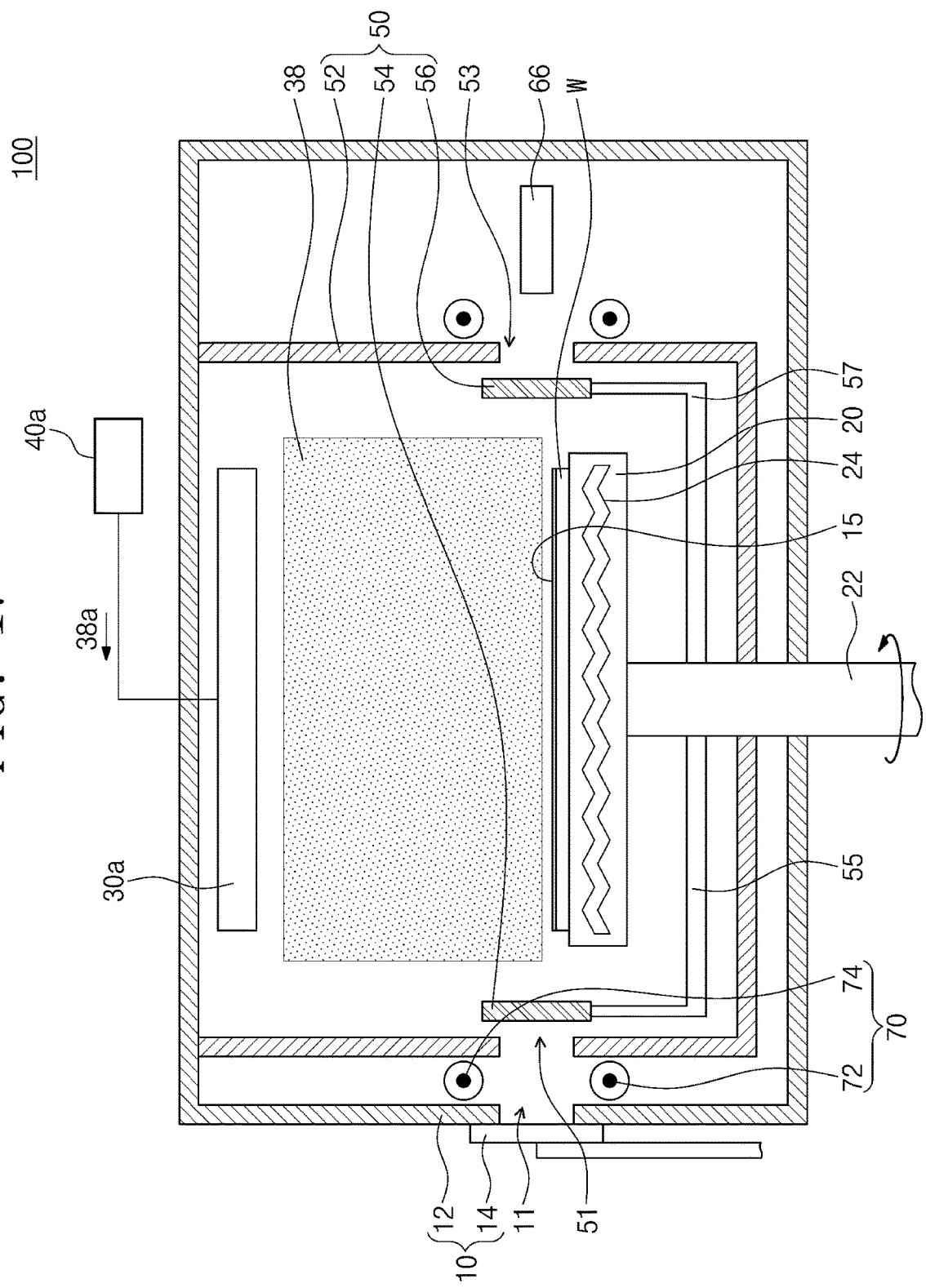
FIG. 17 is a sectional view illustrating an apparatus of fabricating a semiconductor device, according to an example embodiment.

FIG. 17 is a sectional view illustrating a fabrication apparatus 100, which is used to fabricate a semiconductor device, according to an example embodiment.

Referring to FIG. 17, the fabrication apparatus 100 may include a chemical vapor deposition (CVD) system. In some embodiments, the fabrication apparatus 100 may include a shower head 30a and a gas supplier 40a. The shower head 30a may be provided in an upper region of an internal space of the chamber 10. The gas supplier 40a may be used to supply a reaction gas 38a to the shower head 30a. The shower head 30a may be configured to spray the reaction gas 38 onto the substrate W. The reaction gas 38 may be used to form the thin film 15 on the substrate W. The heater chuck 20 and the edge heating structure 70 may be configured to uniformly heat the substrate W, and this may make it possible to improve thickness uniformity of the thin film 15 to be deposited on the substrate W. In some embodiments, the chamber 10, the heater chuck 20, the heat-dissipation shield 50, the shutter structure 60, and the edge heating structure 70 may be configured in a similar manner as those described with reference to FIG. 2.

According to some embodiments, provided is an apparatus including an edge heating structure, which is configured to reduce a spatial variation in temperature of the substrate, and thus, it may be possible to form a thin layer with improved thickness uniformity.

While example embodiments have been particularly shown and described, it will be understood by one of ordinary skill in the art that variations in form and detail may be made therein without departing from the spirit and scope of the attached claims.

What is claimed is:

1. A method of fabricating a semiconductor device, comprising:
   providing a substrate on a heater chuck in a chamber including a housing and a slit valve, wherein the slit valve is configure to open or close a portion of the housing;
   heating the substrate using the heater chuck; and
   depositing a phase transition layer on the substrate by a physical vapor deposition method using a heat-dissipation shield between the housing and the heater chuck, and an edge heating structure between the heat-dissipation shield and the housing,
   wherein the edge heating structure comprises:
      an upper lamp provided above a level of a top surface of the slit valve, and
      a lower lamp provided below a level of a bottom surface of the slit valve, and
   wherein the heat-dissipation shield includes a tube shield, which extends from a top portion of the housing to a region below the heater chuck and has a first opening adjacent to the slit valve.

2. The method of claim 1, wherein the heater chuck is rotated by a shaft in a bottom of the housing, and the heat-dissipation shield further comprises a first sector shield configured to open or close the first opening.

3. The method of claim 2, wherein the first sector shield is connected to the shaft by a first branch arm.

4. The method of claim 2, wherein the tube shield has a second opening opposed to the first opening.

5. The method of claim 4, wherein the heat-dissipation shield further comprises a second sector shield configured to open of close the second opening.

6. The method of claim 5, wherein the second sector shield is connected to the shaft by a second branch arm.

7. The method of claim 2, wherein the first sector shield configured to close the first opening when the slit valve is closed.

8. A method of fabricating a phase transition memory device, comprising:
   forming a lower electrode on a substrate;
   forming a mold layer having a contact hole exposing the lower electrode; and
   forming a phase transition layer in the contact hole,
   wherein forming the phase transition layer in the contact hole comprises:
      providing the substrate on a heater chuck in a chamber including a housing and a slit valve, wherein the slit valve is configured to open or close a portion of the housing;
      heating the substrate using the heater chuck; and
      depositing the phase transition layer on the substrate by a physical vapor deposition method using a heat-dissipation shield between the housing and the heater chuck, and an edge heating structure between the heat-dissipation shield and the housing,
   wherein the edge heating structure comprises:
      an upper lamp provided above a level of a top surface of the slit valve; and
      a lower lamp provided below a level of a bottom surface of the slit valve, and
   wherein the heat-dissipation shield includes a tube shield, which extends from a top portion of the housing to a region below the heater chuck and has a first opening adjacent to the slit valve.

9. The method of claim 8, further comprising:
   forming a word line on the substrate in a first direction;
   forming a first mold layer exposing a portion of the word line; and
   forming a diode on the word line exposed by the first mold layer.

10. The method of claim 9, further comprising:
    forming an upper electrode on the phase transition layer; and
    forming a bit line on the upper electrode in a second direction intersecting the first direction.

11. The method of claim 8, wherein forming of the phase transition layer comprises polishing the phase transition layer.

12. The method of claim 8, wherein the heater chuck is rotated by a shaft in a bottom of the housing, and the heat-dissipation shield further comprises a first sector shield configured to open or close the first opening.

13. The method of claim 12, wherein the first sector shield is connected to the shaft by a first branch arm.

14. The method of claim 12, wherein the tube shield has a second opening opposed to the first opening.

15. The method of claim 14, wherein the heat-dissipation shield further comprises a second sector shield configured to open of close the second opening.

16. The method of claim 15, wherein the second sector shield is connected to the shaft by a second branch arm.

17. The method of claim 12, wherein the first sector shield is configured to close the first opening when the slit valve is closed.

18. A method of fabricating a semiconductor device, comprising:
    providing a substrate on a heater chuck in a chamber including a housing and a slit valve, wherein the slit valve is configured to open or close a portion of the housing;
    heating the substrate using the heater chuck, wherein the heater chuck is rotated by a shaft disposed on a bottom of the housing; and
    depositing a phase transition layer on the substrate by a physical vapor deposition method using a heat-dissipation shield between the housing and the heater chuck, and an edge heating structure between the heat-dissipation shield and the housing,
    wherein the edge heating structure comprises:
       an upper lamp provided above a level of a top surface of the slit valve, and
       a lower lamp provided below a level of a bottom surface of the slit valve,
    wherein the heat-dissipation shield comprises:
       a tube shield, which extends from a top portion of the housing to a region below the heater chuck and has a first opening adjacent to the slit valve and a second opening opposed to the first opening,
       a first sector shield connected to the shaft and configured to open or close the first opening, and
       a second sector shield connected to the shaft and configured to open or close the second opening.

19. The method of claim 18, wherein the first sector shield is connected to the shaft by a first branch arm.

20. The method of claim 18, wherein the second sector shield is connected to the shaft by a second branch arm.

* * * * *